(12) United States Patent
Van Der Meulen et al.

(10) Patent No.: US 7,170,583 B2
(45) Date of Patent: Jan. 30, 2007

(54) LITHOGRAPHIC APPARATUS IMMERSION DAMAGE CONTROL

(75) Inventors: Frits Van Der Meulen, Breda (NL); Henrikus Herman Marie Cox, Eindhoven (NL); Martijn Houkes, Sittard (NL); Robertus Johannes Van Vliet, Eersel (NL); Stoyan Nihtianov, Eindhoven (NL); Petrus Wilhelmus Josephus Maria Kemper, Waalre (NL); Roland Petrus Hendrikus Hanegraaf, Heeswijk-Dinther (NL)

(73) Assignee: ASML Netherlands B.V., Veldhoven (NL)

( * ) Notice: Subject to any disclaimer, the term of this patent is extended or adjusted under 35 U.S.C. 154(b) by 64 days.

(21) Appl. No.: 11/169,298

(22) Filed: Jun. 29, 2005

(65) Prior Publication Data

US 2007/0002294 A1    Jan. 4, 2007

(51) Int. Cl.
G03B 27/42 (2006.01)
G03B 27/58 (2006.01)

(52) U.S. Cl. .......................... 355/53; 355/72
(58) Field of Classification Search .................. 355/53, 355/67, 72, 77
See application file for complete search history.

(56) References Cited

U.S. PATENT DOCUMENTS

| | | | |
|---|---|---|---|
| 4,509,852 A | 4/1985 | Tabarelli et al. | 355/30 |
| 4,918,977 A * | 4/1990 | Takahashi et al. | 73/40.5 R |
| 5,177,996 A * | 1/1993 | Sahakian | 73/40 |
| 6,438,074 B1 * | 8/2002 | Aki et al. | 369/16 |
| 7,057,702 B2 * | 6/2006 | Lof et al. | 355/30 |

FOREIGN PATENT DOCUMENTS

| | | |
|---|---|---|
| EP | 1 420 300 A2 | 5/2004 |
| WO | WO 99/49504 | 9/1999 |

* cited by examiner

*Primary Examiner*—Rodney Fuller
(74) *Attorney, Agent, or Firm*—Pillsbury Winthrop Shaw Pittman, LLP

(57) ABSTRACT

A lithographic apparatus includes a substrate table to hold a substrate; a substrate table position measurement system to measure a position quantity of the substrate table, a projection system to project a patterned radiation beam onto a target portion of the substrate, a fluid supply system to supply an immersion fluid in a space between a downstream lens of the projection system and the substrate, and a fluid supply system position measurement system to measure a position quantity of the fluid supply system. To prevent a collision between the fluid supply system and the substrate table, a damage control system of the lithographic apparatus may include a calculator to calculate a dimensional quantity of a gap between the fluid supply system and the substrate table from the positioned quantity of the substrate table and the position quantity of the fluid supply system. The damage control system may generate a warning signal when the dimensional quantity goes beyond a predetermined safety level.

25 Claims, 4 Drawing Sheets

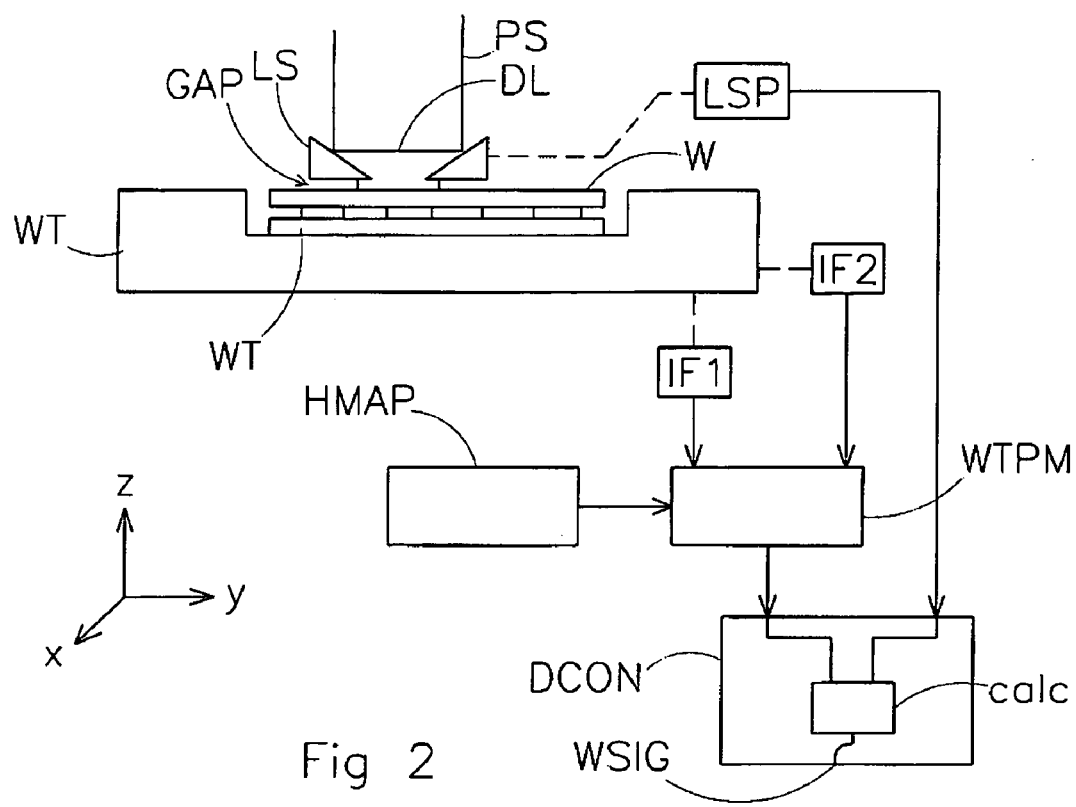
Fig 2
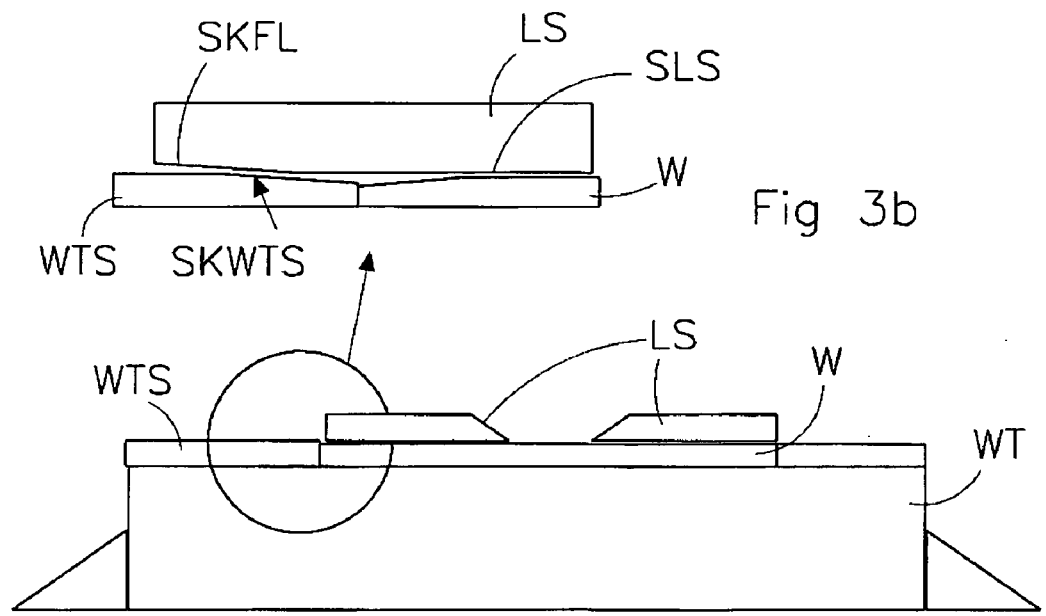
Fig 3b
Fig 3a

LITHOGRAPHIC APPARATUS IMMERSION DAMAGE CONTROL

BACKGROUND

1. Field of the Invention

The present invention relates to an immersion type lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g., water, so as to fill a space between the final element of the projection system, i.e., the bottom of the projection system, and the substrate, thus providing an example of an immersion type lithographic apparatus. This enables more accurate projections and imaging of smaller features since the exposure radiation will have a shorter wavelength in the liquid. The effect of the immersion liquid may also be regarded as increasing the effective numerical aperture number NA of the system and also increasing the depth of focus. Other immersion liquids have been proposed, including water with solid particles (e.g., quartz) suspended therein. Thus, a lithographic apparatus may be provided with a fluid provider which is arranged to provide the immersion liquid, or to keep the liquid in its place. The liquid may be flowing to avoid local heating.

The substrate, or the substrate and the substrate table, may be immersed in a bath of immersion liquid. An example of such an arrangement is disclosed in U.S. Pat. No. 4,509,852 which hereby is incorporated by reference in its entirety. Alternatively, the immersion liquid may be provided by a liquid supply system only on a localized area of the substrate and in between the final element of the projection system and the substrate using a liquid confinement system, the substrate generally having a larger surface area than the final element of the projection system. An example of such an arrangement is disclosed in International Patent Application No. 99/49,504 which hereby is incorporated by reference in its entirety. The liquid is supplied by at least one inlet on the substrate, preferably along a direction of movement of the substrate relative to the final element of the projection system, and the liquid is discharged by at least one outlet which may be connected to a low pressure source. Various orientations and numbers of inlets and outlets positioned near the periphery of the final element are possible. Further, a liquid supply system may be provided with a seal member which extends along at least a part of a boundary of the space between the final element of the projection system and the substrate table. The seal member is substantially stationary relative to the projection system in the XY plane though there may be some relative movement in the Z direction (the direction of the optical axis of the projection system). A seal is formed between the seal member and the surface of the substrate. Preferably the seal is a contactless seal such as a gas seal, which may further function as a gas bearing. An example of such an arrangement is disclosed in European Patent Application No. 03252955.4 which hereby is incorporated by reference in its entirety.

European Patent Application No. 03257072.3, which hereby is incorporated by reference in its entirety, discloses a twin or dual stage immersion lithography apparatus. Such an apparatus is provided with two stages for supporting the substrate. Leveling measurements are carried out with a stage at a first position, without the presence of an immersion liquid, and exposure is carried out with a stage at a second position, where an immersion liquid is present. Alternatively, the apparatus has only one stage.

In a known implementation of a lithographic apparatus making use of immersion as described above, the liquid supply system to provide the immersion liquid is guided with respect to the substrate and/or the substrate table by a gas bearing, such as an air bearing. The gas bearing provides for a flow of a gas in a gap between the liquid supply system and the substrate or substrate table. Effectively, the liquid supply system may rest on a layer of such gas which flows in the gap. By the use of such a gas bearing, a certain amount of safety is obtained as the gas bearing commonly provides for a minimum distance between the liquid supply system and the substrate or substrate table. Further, to avoid a level difference between a surface of the substrate and a surface of a surrounding part of the substrate table which surrounds the substrate, a selection mechanism may have been implemented to select a substrate on its thickness. A substrate having a thickness which is too large or too small may be denied access to the lithographic apparatus, as the processing of such a substrate in the lithographic apparatus might result in a level difference between the substrate and the surface of the substrate table surrounding the substrate, which could result in a crash of the liquid supply system against the substrate resp. the substrate table, when passing from the substrate to the substrate table or vice versa. Such a crash is likely to occur in case that a height difference between a surface of the substrate and a surface of the substrate table surrounding the substrate amounts to a height of the gap between the substrate resp. the substrate table and the liquid supply system, or more.

SUMMARY

According to an embodiment of the invention, there is provided a lithographic apparatus comprising: a substrate table constructed to hold a substrate, a substrate table position measurement system to measure a position quantity of the substrate table, a projection system configured to project a patterned radiation beam onto a target portion of the substrate, a fluid supply system to supply an immersion fluid in a space between a downstream lens of the projection system and the substrate, a fluid supply system position measurement system to measure a position quantity of the fluid supply system, and a damage control system to prevent a collision between the fluid supply system and the substrate table holding the substrate, the damage control system comprising a calculator to calculate a dimensional quantity of a gap between the fluid supply system and the substrate table holding the substrate from the position quantity of the substrate table and the position quantity of the fluid supply system, the damage control system to generate a warning signal when the dimensional quantity goes beyond a predetermined safety level.

In another embodiment of the invention there is provided a lithographic apparatus comprising: a substrate table constructed to hold a substrate, a projection system configured to project a patterned radiation beam onto a target portion of the substrate, a fluid supply system to supply an immersion fluid in a space between a downstream lens of the projection system and the substrate, a fluid supply system position control system to control a position of the fluid supply system, and a damage control system to prevent a collision between the fluid supply system and the substrate table holding the substrate, the damage control system to compare an actuator drive signal to drive an actuator of the fluid supply system position control system, the actuator to affect the position of the fluid supply system, with a predetermined threshold, and to generate a warning signal when the actuator drive signal goes beyond the threshold.

According to a further embodiment of the invention, there is provided a lithographic apparatus comprising: a substrate table constructed to hold a substrate, a projection system configured to project a patterned radiation beam onto a target portion of the substrate, a fluid supply system to supply an immersion fluid in a space between a downstream lens of the projection system and the substrate, and a leakage detection system to detect leakage of the immersion fluid from the fluid supply system, the leakage detection system comprising two mutually isolated electrical conductors located at a potential leakage zone of the fluid supply system, the leakage detection system being constructed to detect leakage by measuring an electrical capacitance between the mutually isolated electrical conductors.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 depicts a schematic view of a part of a lithographic apparatus according to an embodiment of the invention;

FIGS. 3a and 3b schematically depicts a substrate table and fluid supply system of a lithographic apparatus according to another embodiment of the invention;

DETAILED DESCRIPTION

Figure 1:
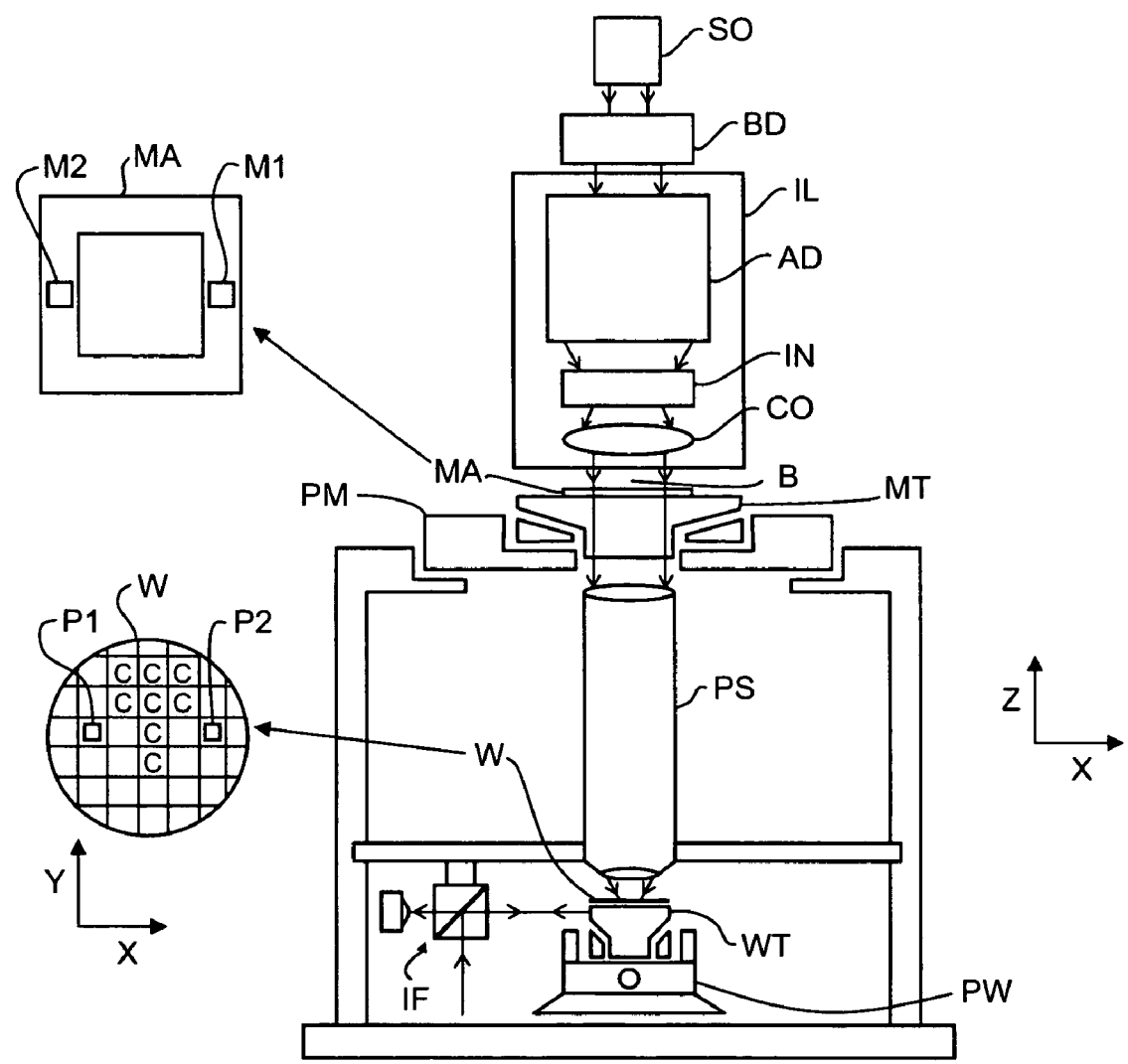
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "ubstrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

It is noted that, where in this document the term substrate table or wafer is used, this may be understood as what may be referred in the art as a stage or a chuck, i.e., an assembly of a mirror block (on which, e.g., interferometer beams of the position sensor IF may be reflected) and a table which is mounted thereto, the table to hold the substrate. The stage may further comprise non stationary parts of the positioner PW.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 shows a substrate table WT holding a substrate W. A projection system PS projects, e.g., a pattern onto a target portion of the substrate W. A fluid supply system, in this embodiment a liquid supply system LS provides for an immersion fluid, in this example an immersion liquid in a space between a downstream lens DL of the projection system PS and the substrate W. Further, FIG. 2 schematically indicates a liquid supply system position measurement system LSP, as an example of a fluid supply system position measurement system, to measure a position quantity of the liquid supply system. Interferometers IF1 and IF2 measure a beam length between the respective interferometers IF1, IF2 and the substrate table WT. Therewith, a substrate table position measurement system WTPM is able to determine a position of the substrate table WT. Further, a damage control system is provided to prevent a collision between the fluid supply system, or more specifically, in this example the liquid supply system LS, and the substrate table holding the substrate. The damage control system DCON comprises a calculator CALC to calculate a dimensional quantity of a GAP between the liquid supply system and the substrate table resp. substrate. The calculator CALC calculates this dimensional quantity from the position quantity of the substrate table as provided by the substrate table position measurement system WTPM and the position quantity of the liquid supply system as provided by the liquid supply system position measurement system LSP. The damage control system is able to generate a warning signal when the dimensional quantity goes beyond a predetermined safety level. Therefore, the damage control system DCON may be provided with a comparator to compare the dimensional quantity of the gap with the predetermined safety level.

The substrate table position measurement system may make use of any type of position sensors, such as encoders, capacitive position sensors, interferometers, or any combination of known position measurement devices. The immersion fluid may comprise an immersion liquid or an immersion gas. The immersion liquid may comprise any suitable liquid, in current implementations a water, such as an ultra-pure water, is applied, however, also other liquids are imaginable. The liquid supply system position measurement system, or in more general words, the fluid supply system position measurement system, makes use of any type of position sensors, e.g., one or more single of multidimensional encoders, one or more interferometers, one or more capacitive position sensors, or any other position sensor which may be known per se as well as any combination of position sensors. The substrate table position measurement system, fluid supply system position measurement system and damage control system may be implemented partly or fully in dedicated hardware, such as dedicated electronics, however, it is also possible that at least a part of the functionality of these elements of the lithographic apparatus is implemented in a form of suitable software instructions which may be executed on a computing device, such a microprocessor, microcontroller, microcontroller network, computer network, etc. Also, it is possible that at least a part of this functionality is implemented in a programmable device, such as a programmable electronic circuit.

FIG. 2 depicts an X, Y and Z axis. The Y and Z axis are to be understood as being in a plane of drawing of FIG. 2. The X axis is in this highly schematic drawing, to be understood as being perpendicular to the plane of drawing. Further, it is to be understood that the X, Y and Z axes refer to the substrate table WT, substrate W, liquid supply system LS and projection system PS only, while further elements depicted in FIG. 2 are depicted as in a block schematic manner only, hence not having a relation with the X, Y and Z axis as depicted.

The position quantity of the substrate table resp. the position quantity of the liquid supply system may comprise any position quantity, including a position, a velocity, an acceleration, etc. Likewise, the dimensional quantity of the gap may also include any type of dimensional quantity, including, e.g., a distance, a velocity of change of the distance, an acceleration of the fluid supply system and substrate table resp. substrate with respect to each other, etc. Further, when in this document the wording "the substrate table holding the substrate" are applied, such as in the context of a gap between the liquid supply system and the substrate table holding the substrate, this is to be understood as comprising the substrate, the substrate table and/or both of them. Thus, in the example of a gap between the liquid supply system and the substrate table holding the substrate, this is to be understood as a gap between the liquid supply system and the substrate table, a gap between the liquid supply system and the substrate table as well as the substrate.

The damage control system as described above enables to prevent damage of the liquid supply system resp. the substrate and/or substrate table by calculating a dimensional quantity of the gap between the liquid system and the substrate resp. substrate table. It is possible to make use of existing, i.e., known position measurement systems for the fluid supply system position measurement system and the substrate table position measurement system, i.e., make use of position measurement systems which are already present in a known lithographic apparatus. This reduces an amount of additional hardware to be included in the lithographic apparatus, thus simplifying an implementation thereof. The lithographic apparatus as described here may prevent a damage of the liquid supply system, substrate and/or substrate table by a crash between the liquid supply system and the substrate, substrate table or both. The embodiment as described here is especially beneficial in combination with a liquid supply system, or in general words a fluid supply system, which is positioned actively, and does not benefit from the inherent safety issues as present with a liquid supply system which is guided by a gas bearing according to the state of the art. Such active positioning of the liquid supply system may include a positioning using any type of actuator, comprising a motor, such as an electric motor, a piezo drive, a pneumatic positioning, etc.

The position quantity of the fluid supply system may comprise a rotational position of the fluid supply system with respect to a focus plane of the projection system. The focus plane of the projection system may be located in a plane which is substantially parallel to a plane defined by the X and Y axis. The position quantity of the fluid system may in this preferred embodiment further comprise a position of the fluid supply system along an axis substantially perpendicular to the focus plane, i.e., along the Z axis. In the context of this document, the term "rotational position" is to be understood as a rotation with respect to the plane as mentioned. The rotational position may here thus comprise a rotation with respect to the X axis and/or a rotation with respect to the Y axis. This preferred embodiment allows a relatively simple implementation. According to the state of the art, the position of the substrate table is commonly measured in 6 degrees of freedom (three dimensions along a three dimensional coordinate system comprising three axes, as well as three rotations with respect to the respective axis). In case that as the dimensional quantity of the gap a distance between the respective parts may be used, it is required to obtain from the liquid supply system the position thereof along the Z axis in FIG. 2 as well as the rotation thereof with respect to a plane defined by the X and Y axis, to obtain all necessary position information to calculate a dimension of the gap.

Preferably, the dimensional quantity of the gap comprises a local minimum distance between the substrate table holding the substrate and the fluid supply system, the calculator being constructed to determine the local minimum distance from the rotational positions of the fluid supply system and of the substrate table holding the substrate respectively, the rotational positions with respect to a focus plane of the projection system and from the positions of the fluid supply system and of the substrate table holding the substrate respectively, the positions along an axis substantially perpendicular to the focus plane of the projection system. The term "local minimum distance" is to be understood as a minimum distance between the substrate table resp. the substrate and the liquid supply system, i.e., the distance at a location where the distance is minimum. Thus, assuming that the liquid supply system is in FIG. 2 rotated slightly to the right in the plane of drawing, i.e., is rotated with respect to the X axis in a clockwise manner, then the local minimum distance will be found at the right side of the liquid supply system in the plane of drawing. A benefit of calculating the local minimum distance is that this distance is a parameter that may be used to prevent a crash, as at the position where the gap is minimum, i.e., where the minimum distance occurs, safety is most desirable, as a collision is at that position more likely than at another position where the distance is larger.

In addition to or instead of the above preferred embodiments, it is also possible that the position quantity of the substrate table comprises a position of the substrate table and a height map HMAP of the substrate held by the substrate table, the dimensional quantity of the gap comprising a distance between the substrate table holding the substrate and the fluid supply system, the calculator to calculate the distance from the position of the substrate table, the height map HMAP of the substrate and the position of the fluid supply system. The height map HMAP of the substrate may have been determined by a second stage in a dual stage lithographic apparatus, or may have been determined by another measurement device. The height map HMAP comprises height information or thickness information at a plurality of locations on the substrate, thus provides a location dependent thickness or height information of the substrate. The height map may further comprise height information of a part of the substrate table surrounding the substrate. A benefit of making use of the height map is that it allows to take into account height variations of the substrate: at a location where the substrate is relatively thick, a gap between the liquid supply system and the substrate will be smaller than a location of the substrate where the substrate is relatively thin. Also, due to processing and addition of layers on to the substrate, a thickness thereof might increase during a manufacturing process, thus leading to a decrease in gap between the liquid supply system and the substrate.

Instead of or in addition to the use of a position for the position quantity, thus instead of or in addition to the position quantity of the substrate table resp. of the liquid supply system, it is also possible that the position quantity comprises a speed, such as a speed of the substrate table resp. a speed of the liquid supply system. The speed may have been determined by a speed measurement, e.g., making use of a suitable centre to measure a speed of the liquid supply system resp. the substrate table, a practical implementation which is relatively simply and reliable to implement may however be to determine a position of the respective part (i.e., liquid supply system and/or substrate table) at a first moment in time and determine a position of the respective part at a second moment in time and calculate, using a calculator such as microprocessor, microcontroller, or dedicated hardware, a speed from the positions measured at the two moments in time.

A benefit of making use of speed as a position quantity is that is allows to generate a warning message at an early moment in time: in a situation where the liquid supply system and the substrate table appear to have a speed towards each other, a critical situation may already be predicted in case that the speed exceeds a certain value. Due to an inertia of the substrate table resp. liquid supply system, a speed of these elements towards each other may likely result in a crash because of the small size of the gap. Therefore, a preferred embodiment wherein the position quantity comprises a speed will result in a high likelihood of preventing a crash as a condition wherein a crash might occur can be estimated easily on beforehand. In an embodiment, it is possible to determine the speed by measuring the position of the liquid supply system resp. the substrate table at two moments in time, e.g., at two consecutive sampling times, and estimate a speed of the respective part from a position difference between the position measurements at the first and second moment in time. From the speeds of the liquid supply system resp. the substrate table, a relative speed with respect to each other can be calculated, and a warning message may be generated when the relative speed goes beyond a predetermined safety level.

All embodiments of the invention as described above may also be combined with the embodiment that the position quantity comprises a speed, providing, in addition to the benefits of the preferred embodiments as described above, as an additional benefit that a critical situation may be recognized earlier, as e.g., a rotational speed, a speed of change of a local minimum distance, etc. may provide for an earlier recognition of a critical situation. Further, it is possible that the position quantity comprises a position as well as a speed, making a more refined recognition of a critical situation possible: in case of a large distance between the respective parts, a higher speed towards each other may be tolerated, while the smaller the distance between the respective parts, the less speed towards each other the parts may have.

FIG. 3a depicts a substrate W which is positioned on a substrate table WT. A liquid supply system LS is positioned on top of the substrate W. FIG. 3a further shows a structure of WTS of the substrate table. The structure may comprise a closing disc, a transmission image sensor, or may comprise various other elements and functions. A problem may now arise when a surface of the structure WTS is not level with a surface of the substrate W, such as is schematically depicted in FIG. 3a. This may namely results in a crash between the liquid supply system LS and the structure WTS in case that the liquid supply system LS would move to the left in the plane of drawing of FIG. 3a. To at least partly alleviate this problem, in a preferred embodiment it is proposed to provide a surface of the fluid liquid supply system facing the substrate table with a skewed edge SKFL of the fluid supply system, such as is depicted in FIG. 3b. In an embodiment, the skewed edge of the liquid supply system comprises an inclination of 1 in a direction perpendicular to the surface SLS of the liquid supply system versus at least 10 in a direction parallel to the surface SLS of the liquid supply system facing the substrate table.

Instead of or in addition to the skewed edge of the liquid supply system, it is also possible that a surface of a structure of the substrate table in operation facing the fluid supply system is confined by a skewed edge of the structure of the substrate table SKWTS. To avoid damage in case of a collision, it is preferred that the skewed edge of the structure of the substrate table SKWTS comprises an inclination of 1 in a direction perpendicular to the surface of the structure of the substrate table versus at least 10 in a direction parallel to the surface of the structure of the substrate table. In case that a crash would occur, damage may be prevented as due to the skewed edge SKFL and/or SKWTS, the respective parts of the liquid supply system LS and the structure WTS will slide over each other without causing any substantial damage thereto. Further, to minimize a damage in case of a crash, the surface of the fluid supply system and the surface of the structure of the substrate table may each comprise a material having a substantially similar hardness.

Figure 4:
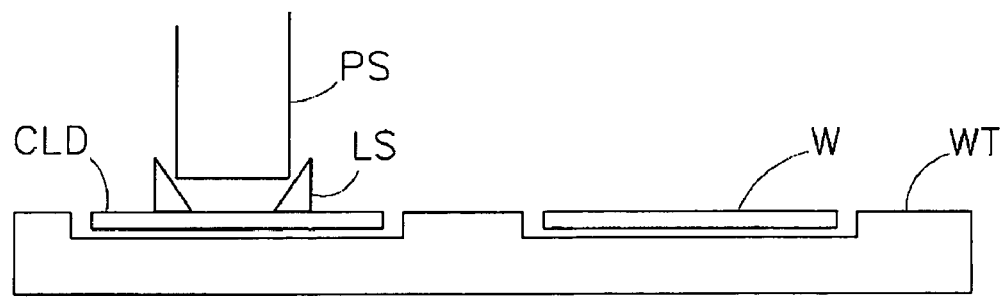
FIG. 4 schematically depicts a positioning of the liquid supply system and substrate table of a lithographic apparatus according to still another embodiment of the invention, for performing a calibration.

FIG. 4 depicts a substrate table WT holding a substrate W. The substrate table WT has been moved with respect to the projection system PS such that the substrate W may be removed from the substrate table WT by, e.g., a suitable substrate handler. It may thus be possible that the substrate table WT has been moved to the right in the plane of drawing or that the projection system PS has been moved to the left in the plane of drawing. The liquid supply system LS is now closed by a closing disc CLD to prevent flowing away of the immersion liquid held by the liquid supply system LS. In this embodiment, the closing disc CLD comprises a separate disc, however, it is also imaginable that the closing disc forms an integrate part of the substrate table WT. A callibration of the damage control system as depicted in FIG. 2 may now be performed as the liquid supply system LS is pressed in this situation against the closing disc CLD, which is pressed against the substrate table WT. Therefore, a known position relationship between the liquid supply system LS and the substrate table WT exists in this situation. By now determining the position of the liquid supply system, e.g., with the liquid supply system position measurement system LSPS shown in FIG. 2, and determining the substrate table position by, e.g., the substrate table position measurement system WTPM as shown in FIG. 2, a position difference may be determined and a gap between the liquid supply system and the substrate table calculated by, e.g., the calculator CLAC as depicted in FIG. 2. The outcome of the calculation may then be compared by a comparator (not shown) with an expected dimension of the gap which may comprise a predetermined value, and in case that the calculated dimension of the gap does not correspond to the expected dimension of the gap, a suitable parameter may be recalibrated, e.g., the liquid supply system position measurement system LSP.

The calibration mechanism could thus in FIG. 2 be indicated in block schematic manner by a block which comprises a first input which is provided with an output of the calculator CALC, a second input to which an expected damaging of the gap is provided and an output, the output being provided to the liquid supply system positioning system for calibration thereof. Alternatively, it may be possible that the calibration mechanism provides for a calibration of one or more other, suitable parts, e.g., a calibration of the damage control system DCON, or in particular the calculator CALC. Also a suitable offset may be provided to the calculator CALC to compensate for a difference between the damaging of the gap as calculated and the dimension of the gap as was expected. In the embodiment described here, the closing disc is used, however any other suitable part of the substrate table may be applied also. Further, as depicted in FIG. 4, the closing disc may be located in a suitable recess of the substrate table.

Upon generation of the warning signal, the damage control system may cut-off electrical power to an actuator of the fluid supply positioning system. This provides for a very fast action, as it will result in a very fast stopping of the fluid supply system, e.g., preventing a further approaching by the fluid supply system of the substrate resp. substrate table. Alternatively, it is possible that the damage control system provides a signal to a setpoint of the liquid supply positioning system, i.e., to move the liquid supply positioning system away from the substrate resp. substrate table. It will be appreciated that it is also possible that the damage control system is able to, upon generation of the warning signal, cut off electrical power of a substrate table positioning.

Further, it is possible that the fluid supply system is pushed away from the substrate table when the actuator of the fluid supply positioning system is depowered. Such a force could be provided by a gravity compensator (such as a magnetic gravity compensator) which may be over-dimensioned to provide an upward force on the fluid supply system. Alternatively, or in addition thereto, it is possible that such a force is provided by a gas knife which functions to seal the gap between the liquid system and the substrate table or substrate, a gas stream of the gas knife providing a force on the liquid supply system pushing the liquid supply system away from the substrate table. By such an upward force, whether caused by a gravity compensator, a gas stream, or by any other cause, safety is increased, as the liquid supply system will be moved away from the substrate table or substrate in case that the liquid supply system actuator to position the liquid supply system is depowered, e.g., caused by the warning signal WSIG.

Figure 5:
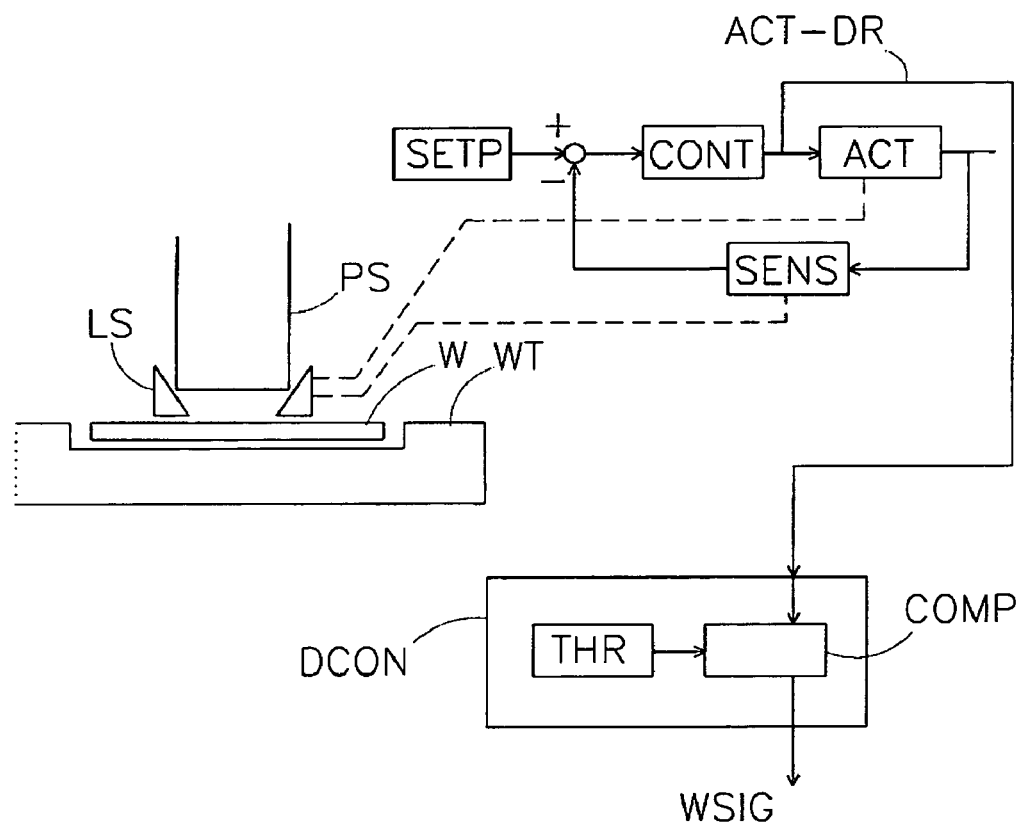
FIG. 5 schematically depicts a part of a lithographic apparatus according to a further embodiment of the invention.

FIG. 5 depicts a substrate W held by a substrate table WT, a projection system PS and a liquid supply system LS. Further, FIG. 5 depicts a liquid supply system position control system comprising a setpoint generator SETP to generate a position setpoint of the liquid supply system LS, a controller CONT, an actuator ACT to drive the liquid supply system LS and a position sensor SENS to measure a position of the liquid supply system. As depicted in FIG. 5, a feedback loop may be created. An actuator drive signal ACT-DR to drive the actuator ACT of the liquid supply system position control system, is provided to the damage control system DCON as schematically indicated in FIG. 5. The damage control system DCON compares by a comparetor COMP the actuator drive signal ACT-DR to a threshold THR, which may be a predetermined threshold, and generates a warning signal WSIG when the actuator drive signal goes beyond the threshold. A gas stream flowing out of the liquid supply system into the gap between the liquid supply system LS and the substrate W or substrate table WT, (the gas stream may serve to confine the liquid in a space determined by the liquid supply system and to prevent it from leaking away into the gap between the liquid supply system and the substrate resp. substrate table) may result in an upward force of the liquid supply system LS with respect to the substrate table WT and/or substrate W. Therefore, the actuator ACT will under normal operating conditions have to apply a downward force on to the liquid supply system LS to compensate for the upward force caused by the gas stream. The closer the liquid supply system gets to the substrate or substrate table, the higher the force due to the gas stream will be, and thus the higher the force by the actuator ACT has to be to compensate for such an upward force on the liquid supply system. This high force to be exerted by the actuator ACT is reflected in a corresponding value of the actuator drive signal ACT-DR. Thus, when the gap gets to a low, critical dimension, a relatively high upward force of the liquid supply system is exerted by the gas stream, which results in a corresponding value of the actuator drive signal. The comparetor may, when the gap gets too small, i.e., below a certain, critical value, detect that the actuator drive signal goes beyond the threshold, and therefore generates the warning signal WSIG. In the context of FIG. 5, the upward force on the liquid supply system has been described as a force caused by a gas stream, such as a gas knife, gas seal, etc., however, the upward force might also be caused by any other mechanism or cause such as a flow of the immersion fluid in a undesired event of a mechanical contact between the fluid supply system and the substrate resp. substrate table.

Figure 6B:
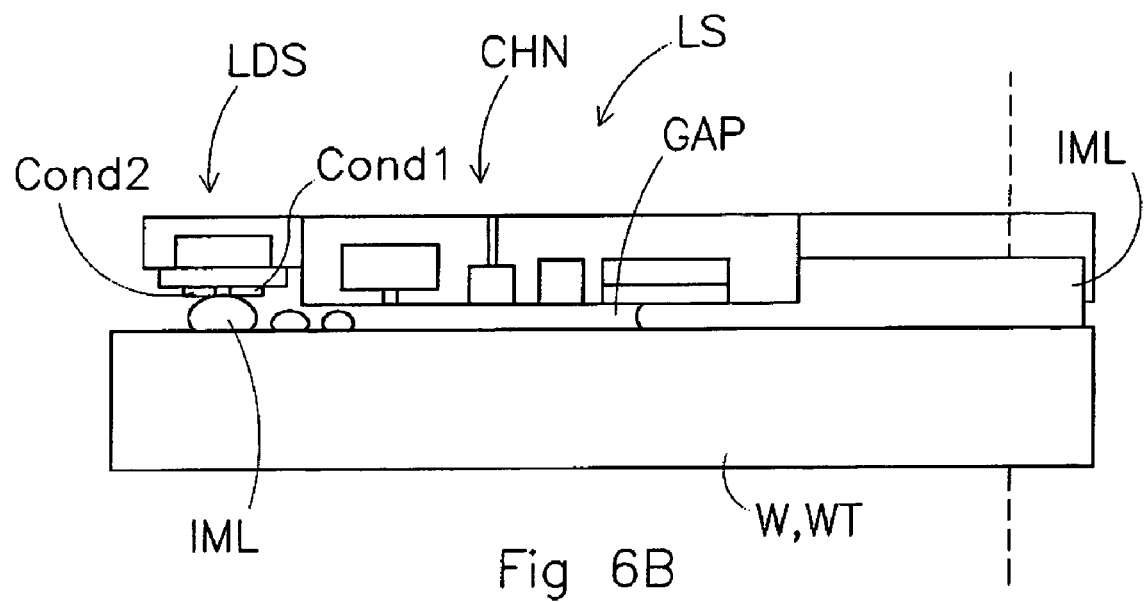
FIGS. 6a and 6b schematically depict a leakage detector of a lithographic apparatus according to a still further embodiment of the invention.
Figure 6A:
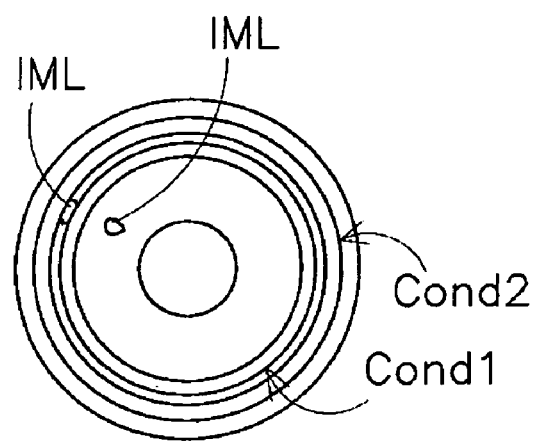

FIG. 6a shows a part of a leakage detection system to detect leakage of the immersion fluid. The leakage detection system comprises a first electrical conductor COND1 and a second electrical conductor COND2. The first and second electrical conductors COND1, COND2 are isolated with respect to each other. Thus, no or substantially no electrical conduction exists between them. The two electrical conductors are located at a potential leakage zone of the fluid supply system. FIG. 6a may for example be understood as a top view of the fluid supply system, in that case a reservoir for holding the immersion liquid will be located concentric with the conductors COND1, COND2 and will be surrounded by the conductors. In case that some of the immersion liquid would leak from the reservoir, and would reach the conductors (examples of drop-lets of immersion liquid IML are drawn in FIG. 6a), then due to the presence of the immersion liquid, an electrical capacitance between the electrical conductors COND1, COND2 will change due to di-electric properties of the immersion liquid IML. The leakage detection system may be constructed to measure an electrical capacitance between the mutually isolated electrical conductors COND1, COND2. A benefit of making use of a capacitive leakage detector is that is allows a contactless measurement because no electrical contact needs to be established between the conductors COND1, COND2 and the immersion liquid, as was the case with conventional leakage detectors which make use of a resistive leakage detector (which thus measured a resistivity between a first and a second conductor, hence requiring electrical connections between the respective conductors and the immersion liquid). Because an electrical contact may be avoided, contamination of the immersion liquid by the conductors or by electrolytic effects, may be avoided. A further benefit of the capacitive leakage detector is that it allows to implement a fast detector, as it omits a parasitic filter which would be formed in a resistive leakage detector by the resistance formed by the immersion liquid in combination with one or more parasitic capacitances. A read-out circuit of the capacitor formed by the two electrical conductors COND1, COND2 may make use of, e.g., a transconductance amplifier or other read out circuitery for a capacitive sensor which may be known per se. The electrical conductors COND1, COND2 may be covered by a substantially non-conductive layer, comprising, e.g., a plastic, to avoid establishing an electrical contact between the conductors COND1, COND2 and (leaking) immersion liquid, hence avoiding electrolysis of the immersion liquid and/or contamination thereof by the conductors.

As shown in FIG. 6a, the two electrical conductors COND1, COND2 may comprise two concentric ring shaped conductors. As explained above, the conductors may be located at a top side of the liquid supply system, thus facing the downstream lens of the projection system, however it is also possible, in addition to or instead of the conductors at the top side, that the conductors are located at a bottom side of the liquid supply system, thus facing the substrate table holding the substrate. In the first case, leakage occurring at a top of the liquid supply system may be detected, while in the latter case leakage occurring at a bottom end of the liquid supply system, i.e., in the gap between the liquid supply system and the substrate or substrate table may be detected.

FIG. 6b depicts a part of a more detailed embodiment showing a cross-sectional side view of a part of the liquid supply system LS holding immersion liquid IML. To prevent a leakage of the immersion liquid IML into the gap GAP a plurality of channels CHN may be provided for sucking away immersion liquid and/or for providing a gas stream to prevent leakage of the immersion liquid etc. If nevertheless some immersion liquid IML passes the channels CHN, the leakage detection system LDS will detect a change in electrical capacitance between the conductors COND1, COND2 as caused by the droplet of immersion liquid IML as drawn in FIG. 6b. It is noted that FIG. 6b is not drawn at the same scale as FIG. 6a, rather FIG. 6b may seem as a detailed magnification of the schematic view of FIG. 6a.

Where in this document the term "liquid supply system" is mentioned, this may also be read as a fluid supply system and vice versa. Further, it is remarked that the substrate table WT as identified in this document may in a practical embodiment consists of a mirror block (one or more sides of which function as a mirror for the interferometers IF1, IF2) on which a table for the substrate may be positioned.

Also, it is remarked that FIGS. 1–6, as will be understood by the skilled person, may (in part) depict a cross-sectional view.

Two or more of the embodiments as depicted in FIGS. 2–6 may be combined in a single lithographic apparatus, however within the context of the invention, each of these embodiments may also be implemented solely.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5–20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a substrate table constructed to hold a substrate;
   a substrate table position measurement system to measure a position quantity of the substrate table;
   a projection system configured to project a patterned radiation beam onto a target portion of the substrate;
   a fluid supply system to supply an immersion fluid in a space between a downstream lens of the projection system and the substrate;
   a fluid supply system position measurement system to measure a position quantity of the fluid supply system; and
   a damage control system to prevent a collision between the fluid supply system and the substrate table holding the substrate, the damage control system comprising a calculator to calculate a dimensional quantity of a gap between the fluid supply system and the substrate table holding the substrate from the position quantity of the substrate table and the position quantity of the fluid supply system, the damage control system to generate a warning signal when the dimensional quantity goes beyond a predetermined safety level.

2. The lithographic apparatus according to claim 1, wherein the position quantity of the fluid supply system comprises a rotational position of the fluid supply system with respect to a focus plane of the projection system and a position of the fluid supply system along an axis substantially perpendicular to the focus plane of the projection system.

3. The lithographic apparatus according to claim 2, wherein the dimensional quantity of the gap comprises a local minimum distance between the substrate table holding the substrate and the fluid supply system, the calculator being constructed to determine the local minimum distance from the rotational positions of the fluid supply system and of the substrate table holding the substrate respectively, the rotational positions with respect to a focus plane of the projection system and from the positions of the fluid supply system and of the substrate table holding the substrate respectively, the positions along an axis substantially perpendicular to the focus plane of the projection system.

4. The lithographic apparatus according to claim 1, wherein the position quantity of the substrate table comprises a position of the substrate table and a height map of the substrate held by the substrate table, wherein the dimensional quantity of the gap comprises a distance between the substrate table holding the substrate and the fluid supply system, the calculator to calculate the distance from the position of the substrate table, the height map of the substrate and the position of the fluid supply system.

5. The lithographic apparatus according to claim 1, wherein the dimensional quantity of the gap comprises a speed of change of a distance between the fluid supply system and the substrate table holding the substrate.

6. The lithographic apparatus according to claim 1, wherein the position quantity of the fluid supply system comprises a rotational speed of the fluid supply system with respect to a focus plane of the projection system and a speed of the fluid supply system along an axis substantially perpendicular to the focus plane of the projection system.

7. The lithographic apparatus according to claim 6, wherein the dimensional quantity of the gap comprises a speed of change of a local minimum distance between the substrate table holding the substrate and the fluid supply system, the calculator being constructed to determine the speed of change of the local minimum distance from the rotational speeds of the fluid supply system and of the substrate table holding the substrate respectively, the rotational speeds with respect to a focus plane of the projection system and from the speeds of the fluid supply system and of the substrate table holding the substrate respectively, the speeds along an axis substantially perpendicular to the focus plane of the projection system.

8. The lithographic apparatus according to claim 1, wherein the position quantity of the substrate table comprises a speed of the substrate table and a height map of the substrate held by the substrate table, wherein the dimensional quantity of the gap comprises a speed of change of the distance between the substrate table holding the substrate and the fluid supply system, the calculator to calculate the speed of change from the position of the substrate table, the height map of the substrate and the position of the fluid supply system.

9. The lithographic apparatus according to claim 1, wherein a surface of the fluid supply system facing the substrate table is confined by a skewed edge of the fluid supply system.

10. The lithographic apparatus according to claim 9, wherein the skewed edge of the fluid supply system comprises an inclination of 1 in a direction perpendicular to the surface of the liquid supply system versus at least 10 in a direction parallel to the surface of the fluid supply system facing the substrate table.

11. The lithographic apparatus according to claim 1, wherein a surface of a structure of the substrate table in operation facing the fluid supply system is confined by a skewed edge of the structure of the substrate table.

12. The lithographic apparatus according to claim 11, wherein the skewed edge of the structure of the substrate table comprises an inclination of 1 in a direction perpendicular to the surface of the structure of the substrate table versus at least 10 in a direction parallel to the surface of the structure of the substrate table.

13. The lithographic apparatus according to claim 1, wherein the surface of the fluid supply system and the surface of the structure of the substrate table each comprise a material having a substantially similar hardness.

14. The lithographic apparatus according to claim 1, wherein the damage control system comprises a calibration mechanism to calibrate the dimension of the gap, the calibration mechanism to calibrate a distance between the substrate table and the liquid supply system when the liquid supply system contacts a part of the substrate table.

15. The lithographic apparatus according to claim 14, wherein the part of the substrate table comprises a closing disk located in a suitable recess of the substrate table.

16. The lithographic apparatus according to claim 1, wherein the damage control system is constructed to, upon generation of the warning signal, cut-off electrical power of an actuator to position the fluid supply system.

17. The lithographic apparatus according to claim 16, wherein the fluid supply system positioning system comprises a gravity compensator to provide a compensation force to compensate for a gravity force acting on the fluid supply system, the compensation force being over dimensioned to provide a resultant upward force on the fluid supply system pushing the liquid supply system away from the substrate table.

18. The lithographic apparatus according to claim 16, wherein the fluid supply system comprises a gas knife to substantially seal the gap between the fluid supply system and the substrate table holding the substrate, a gas stream of the gas knife to provide a force on the liquid supply system pushing the fluid supply system away from the substrate table.

19. A lithographic apparatus comprising:
a substrate table constructed to hold a substrate;
a projection system configured to project a patterned radiation beam onto a target portion of the substrate,
a fluid supply system to supply an immersion fluid in a space between a downstream lens of the projection system and the substrate;
a fluid supply system position control system to control a position of the fluid supply system; and
a damage control system to prevent a collision between the fluid supply system and the substrate table holding the substrate, the damage control system to compare an actuator drive signal to drive an actuator of the fluid supply system position control system, the actuator to affect the position of the fluid supply system, with a predetermined threshold, and to generate a warning signal when the actuator drive signal goes beyond the threshold.

20. The lithographic apparatus according to claim 19, wherein the liquid supply system comprises a gas knife to substantially seal a gap between the liquid supply system and the substrate table holding the substrate, a gas stream of the gas knife to provide a force on the liquid supply system to push the liquid supply system away from the substrate table.

21. A lithographic apparatus comprising:
a substrate table constructed to hold a substrate;
a projection system configured to project a patterned radiation beam onto a target portion of the substrate,
a fluid supply system to supply an immersion fluid in a space between a downstream lens of the projection system and the substrate; and
a leakage detection system to detect leakage of the immersion fluid from the fluid supply system, the leakage detection system comprising two mutually isolated electrical conductors located at a potential leakage zone of the fluid supply system, the leakage detection system being constructed to detect leakage by measuring an electrical capacitance between the mutually isolated electrical conductors.

22. The lithographic apparatus according to claim 21, wherein the two electrical conductors comprise two concentric ring shaped conductors.

23. The lithographic apparatus according to claim 22, wherein the concentric ring shaped conductors are located at a top side of the fluid supply system facing the downstream lens and/or at a bottom side of the fluid supply system facing the substrate table holding the substrate.

24. The lithographic apparatus according to claim 21, wherein the electrical conductors are separated from potentially leaking immersion fluid by a substantially non-conductive layer.

25. The lithographic apparatus according to claim 24, wherein the substantially non conductive layer comprises a plastic.

* * * * *